US008368259B2

(12) United States Patent
Sakai et al.

(10) Patent No.: US 8,368,259 B2
(45) Date of Patent: Feb. 5, 2013

(54) LINEAR MOTOR COMPONENT MOUNTING APPARATUS AND COMPONENT INSPECTING APPARATUS

(75) Inventors: Kiyotaka Sakai, Shizuoka-ken (JP); Naoki Hanamura, Shizuoka-ken (JP)

(73) Assignee: Yamaha Hatsudoki Kabushiki Kaisha (JP)

( * ) Notice: Subject to any disclaimer, the term of this patent is extended or adjusted under 35 U.S.C. 154(b) by 387 days.

(21) Appl. No.: 12/812,376

(22) PCT Filed: Jan. 9, 2009

(86) PCT No.: PCT/JP2009/050170
§ 371 (c)(1),
(2), (4) Date: Jul. 9, 2010

(87) PCT Pub. No.: WO2009/088055
PCT Pub. Date: Jul. 16, 2009

(65) Prior Publication Data
US 2010/0289345 A1  Nov. 18, 2010

(30) Foreign Application Priority Data
Jan. 11, 2008  (JP) .................................. 2008-004642

(51) Int. Cl.
*H02K 41/02* (2006.01)
(52) U.S. Cl. ................................. 310/12.31; 310/12.33
(58) Field of Classification Search ..... 310/12.01–12.33
See application file for complete search history.

(56) References Cited

U.S. PATENT DOCUMENTS 5,072,144 A * 12/1991 Saito et al. ................ 310/12.28
6,911,747 B2 * 6/2005 Tsuboi et al. ............. 310/12.05
(Continued)

FOREIGN PATENT DOCUMENTS

| DE | 10 2006 022 193 A1 | 11/2007 |
|----|--------------------|---------|
| EP | 1 617 545 A2       | 1/2006  |

(Continued)

OTHER PUBLICATIONS

Japanese Office Action "Notice of Reasons for Rejection" dated Aug. 14, 2012; Japanese Patent Application No. 2008-004642; with translation.

(Continued)

*Primary Examiner* — Thanh Lam
(74) *Attorney, Agent, or Firm* — Studebaker & Brackett PC; Donald R. Studebaker (57) ABSTRACT

The invention relates to a linear motor equipped with a field element and an armature and adapted to produce a force causing the field element and the armature to be relatively displaced along a given axial direction by interaction of magnetic fluxes generated between the field element and the armature during an operation of supplying electric power to the armature. In one typical aspect of the invention, the linear motor is provided with: a stator which is formed as one of the field element and the armature; a mover which is formed as the other of the field element and the armature; a frame member which defines the axial direction; a rail which is adapted to guide the mover allowing only to reciprocate in a linear direction; a first positioning portion which is provided on the frame member to set a fixing position of the stator with respect to the frame member; and a second positioning portion which is provided on the frame member to set a fixing position of the rail with respect to the frame member in such a manner as to allow the mover to reciprocate along the axial direction with a given gap formed between the mover and the stator positioned by the first positioning portion.

7 Claims, 6 Drawing Sheets

U.S. PATENT DOCUMENTS

| | | | |
|---|---|---|---|
| 6,917,126 B2 * | 7/2005 | Tsuboi et al. | 310/12.04 |
| 2001/0054851 A1 * | 12/2001 | Tsuboi et al. | 310/12 |
| 2004/0051403 A1 * | 3/2004 | Tsuboi et al. | 310/12 |
| 2005/0258689 A1 * | 11/2005 | Kitade | 310/12 |
| 2006/0186741 A1 * | 8/2006 | Kasahara et al. | 310/12 |
| 2007/0075592 A1 * | 4/2007 | Ohno | 310/12 |
| 2007/0096567 A1 | 5/2007 | Miyamoto et al. | |
| 2009/0260333 A1 | 10/2009 | Kammler et al. | |
| 2009/0278412 A1 | 11/2009 | Kimura et al. | |

FOREIGN PATENT DOCUMENTS

| | | |
|---|---|---|
| JP | 62-119194 | 7/1987 |
| JP | 62-198876 | 12/1987 |
| JP | S63-191876 U | 12/1988 |
| JP | H09-261943 A | 10/1997 |
| JP | 11-043852 | 2/1999 |
| JP | 2003-270295 A | 9/2003 |
| JP | 2005-253259 A | 9/2005 |
| JP | 2006-180645 A | 7/2006 |
| WO | 2006-068322 A1 | 6/2006 |
| WO | 2007/066500 A1 | 6/2007 |

OTHER PUBLICATIONS

The extended European Search Report dated Mar. 4, 2011; European Application No. / Patent No. 09700906.2-2207 / 2234252 PCT/JP2009050170.

International Search Report; PCT/JP2009/050170; Apr. 14, 2009.

* cited by examiner

LINEAR MOTOR COMPONENT MOUNTING APPARATUS AND COMPONENT INSPECTING APPARATUS

TECHNICAL FIELD

The present invention relates to a linear motor, a component mounting apparatus, and a component inspecting apparatus, and more specifically, to a linear motor suitable for a driving mechanism for driving a component-sucking nozzle up and down, and a component mounting apparatus, and a component inspecting apparatus for driving a component-holding member using the motor.

BACKGROUND ART

A linear motor is applied to various industrial machines, including a component mounting apparatus for transferring and mounting an electronic component onto a board. In this component mounting apparatus, a linear motor is used, for example, in a driving mechanism for driving a component-sucking nozzle up and down.

For example, such a linear motor is, as disclosed in a Patent Document 1, provided with a field element having an array of permanent magnets arranged in one direction in such a manner that magnetic poles on the side of surfaces thereof differ from one another, and an armature disposed opposed to the field element and equipped with a core wound with a coil. The linear motor is designed to use one of the field element and the armature as a stator and the other as a mover, and relatively move the mover with respect to the stator linearly in an arrangement direction of the permanent magnets, according to an application of control current to the coil.

Patent Document 1: JP 2005-253259A

DISCLOSURE OF THE INVENTION

In view of allowing a linear motor to generate an adequate propulsion force, it is critical to provide a gap having a given size between a stator and a mover.

In order to define such a gap, it has heretofore been employed to interpose a shim or the like between a stator and a mover to adjust a gap therebetween, and then fix the stator and the mover. However, in cases where there is a strong magnetic attraction force between a core of an armature and a permanent magnet array of a field element which make up the stator and the mover, it is often difficult to assemble the stator and the mover preserving the gap with adequate accuracy because a desired gap cannot be obtained due to deformation of the shim, or the adhesion of the shim tightly clamped between the core and the permanent magnet array, so that it becomes impossible to pull out the shim after assembling.

It is an object of the present invention to improve ease of assembles of a linear motor having such a gap accurately and precisely.

It is another object of the present invention to improve ease of assembles of a linear motor in a component mounting apparatus, and a component inspecting apparatus using the linear motor.

According to one aspect of the present invention, there is provided a linear motor which is equipped with a field element and an armature and adapted to produce a force causing the field element and the armature to be relatively displaced along a given axial direction by interaction of magnetic fluxes generated between the field element and the armature during an operation of supplying electric power to the armature. The linear motor is provided with: a stator formed as one of the field element and the armature; a mover formed as the other of the field element and the armature; a frame member defining the axial direction; a rail adapted to guide the mover allowing to reciprocate only in a linear direction; a first positioning portion provided on the frame member to set a fixing position of the stator with respect to the frame member; and a second positioning portion provided on the frame member to set a fixing position of the rail with respect to the frame member in such a manner as to allow the mover to reciprocate along the axial direction with a given gap formed between the mover and the stator positioned by the first positioning portion.

According to the above structure of the linear motor, the stator is fixed to the frame member while being positioned by the first positioning portion. Also, rail with the mover pre-assembled is fixed to the frame member while being positioned by the second positioning portion. Thus, the stator is fixed to the frame member along the axial direction, and the mover is assembled in a manner being allowed to reciprocate along the axial direction with a given gap formed between the mover and the stator. This makes it possible to perform a motor assembling operation easily and quickly without performing gap adjustment using a shim during assembling of the stator and the mover as in the conventional technique.

According to another aspect of the present invention, there is provided a component mounting apparatus having a component-holding member adapted to be driven upwardly and downwardly by the linear motor.

According to yet another aspect of the present invention, there is provided a component inspecting apparatus having a component-holding member adapted to be driven upwardly and downwardly by the linear motor.

The linear motor of the present invention makes it possible to eliminate a need for performing gap adjustment using a shim during assembling of the stator and the mover as in the conventional technique, and thereby expediting a motor assembling operation. The component mounting apparatus or the component inspecting apparatus according to the present invention also makes it possible to expedite an entire assembling operation because of the benefits as mentioned above.

These and other features and advantages of the present invention will become more apparent from embodiments thereof which will be described with reference to the accompanying drawings.

BEST MODE FOR CARRYING OUT THE INVENTION

With reference to the drawings, the best mode for carrying out the present invention will now be specifically described.

Figure 1:
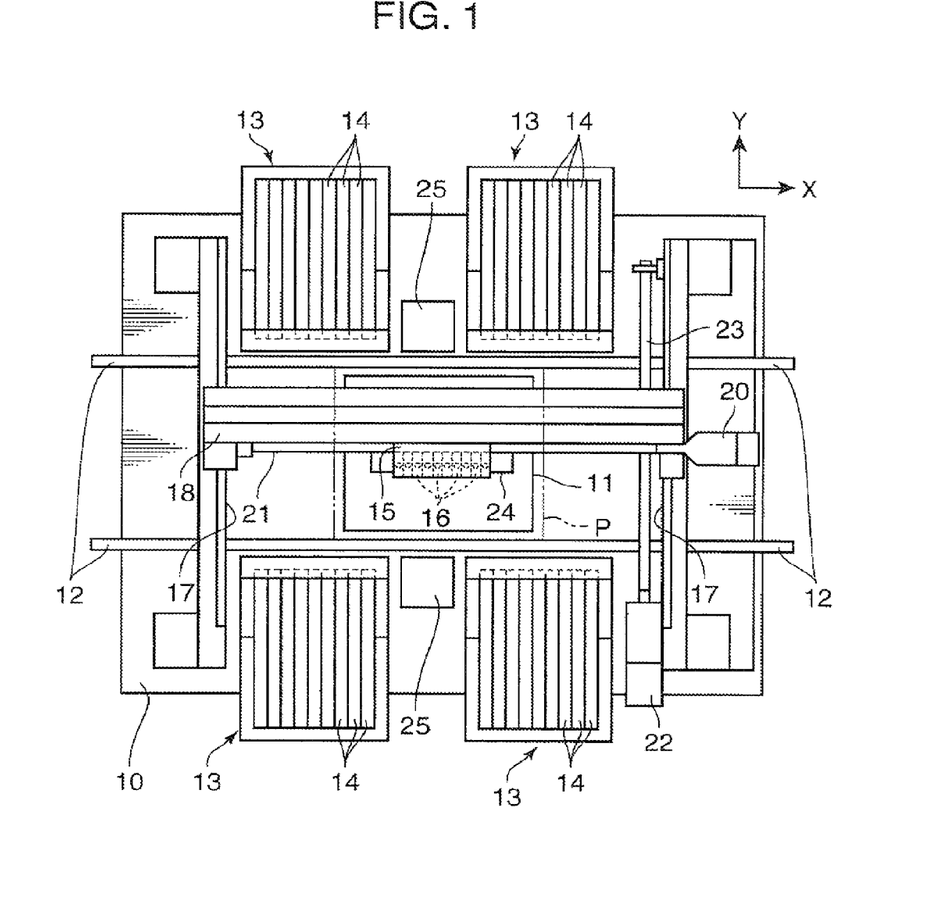
FIG. 1 is a top plan view showing a schematic structure of a component mounting apparatus using a linear motor according the present invention (a component mounting apparatus according to the present invention).

FIG. 1 is a top plan view showing a schematic structure of a component mounting apparatus using a linear motor according the present invention (a component mounting apparatus according to the present invention). In the figures including FIG. 1 which will be used in the following description, XYZ rectangular coordinate axes are shown in order to clarify a directional relationship in each of the figures.

As shown in FIG. 1, a conveyer 12 serving as a board carrying mechanism is set up on a base 10 of the component mounting apparatus. The conveyer 12 is adapted to convey a printed-circuit board P (hereinafter referred to simply as "board P") from a right side to a left side of FIG. 1 to carry the board P in a given operation station (a position of the board P indicated by the two-dot chain line in FIG. 1). A board support unit 11 is disposed in a lower region of the operation station to support the board P by a backup pin during a mounting operation.

A feeder installation area 13 is provided on each of laterally in widthwise (vertically in FIG. 1) opposite sides of the conveyer 12. In each of the feeder installation areas 13, a plurality of component supply devices, such as tape feeders 14, are arranged in parallel along the conveyer 12. Each of the tape feeders 14 retains a reel wound with a tape which receives and holds a plurality of small-piece chip components, such as integrated circuits (ICs), transistors, resistors, or capacitors. The tape feeder is adapted to reel the tape out from the reel to feed each of the components to a component supply position at a distal end of the feeder so as to allow a head unit 15 to pick up the electronic component.

The component-mounting head unit 15 is provided above the base 10. The head unit 15 is designed to, after sucking the component from the tape feeder, transfer the component to a position just above the board P and to mount the component to a given position on the board P. The head unit 15 is also adapted to be movable in each of an X-axis direction (a carrying direction of the board P by the conveyer 12) and a Y-axis direction perpendicular to the X-axis direction, on a given region of a horizontal plane. Specifically, the head unit 15 is supported by a head-unit support member 18 extending in the X-axis direction. Also, the head-unit support member 18 has opposite ends which are supported by a fixed rail 17 extending in the Y-axis direction, so that the head-unit support member 18 can be moved in the Y-axis direction along the fixed rail 17. The head unit 15 is adapted to be driven by an X-axis servomotor 20 in the X-axis direction through a ball screw 21, while the head-unit support member 18 is adapted to be driven by a Y-axis servomotor 22 in the Y-axis direction through a ball screw 23.

Figure 2:
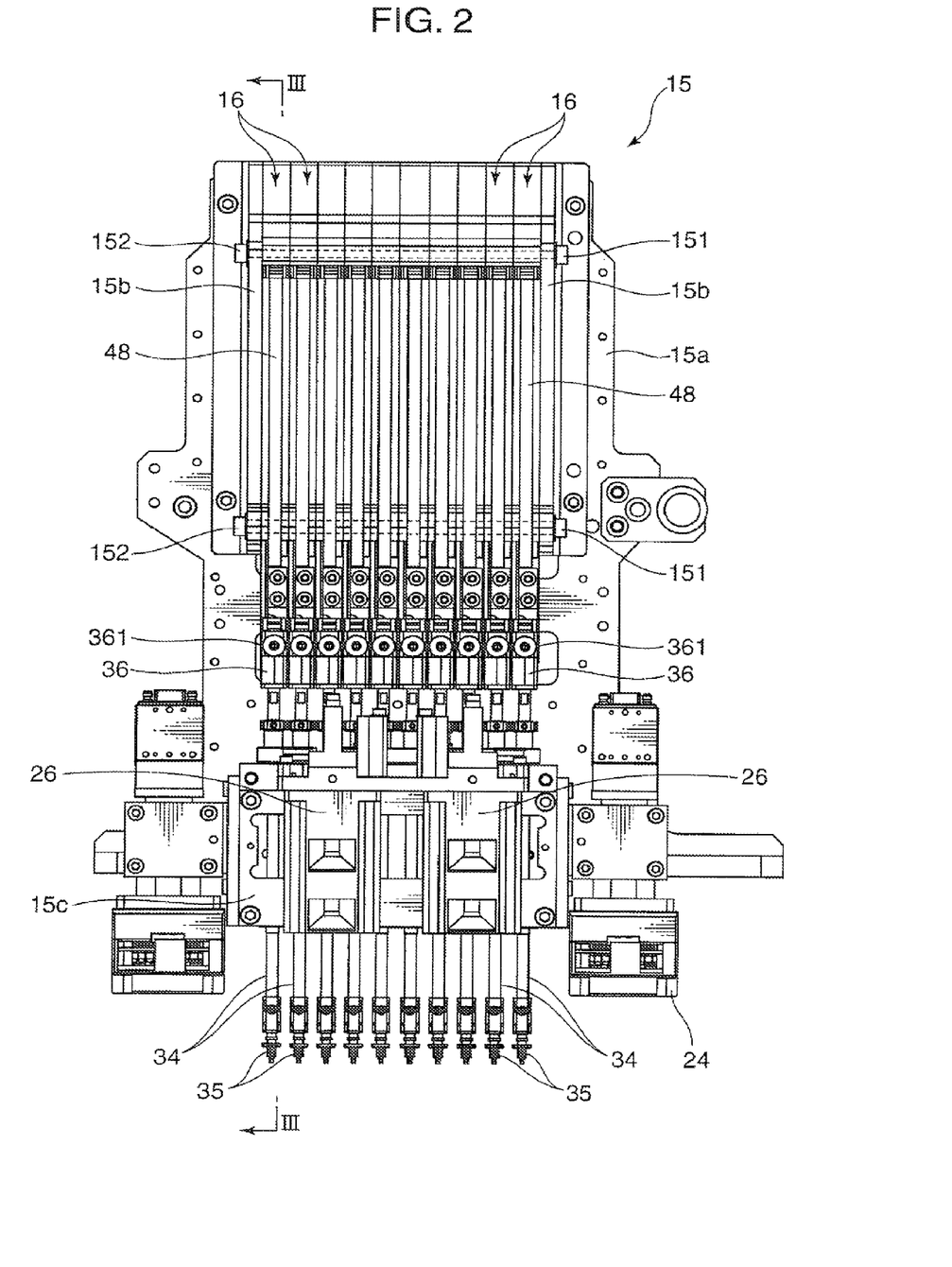
FIG. 2 is a front view showing a specific structure of a head unit.

As shown in FIG. 2, the head unit 15 is provided with a plurality of heads 16 each of which is adapted to hold and transfer the component. In this embodiment, a total of ten heads 16 are arranged in the X-axis direction in a column pattern. Each of the heads 16 has a drive shaft 34 extending in a Z-axis direction (upward-downward direction). A component-sucking nozzle 35 is attached to a distal end (lower end) of the drive shaft 34. The nozzle 35 is connected to a negative-pressure generator unit via an internal passage of the drive shaft 34, a switching valve, and others. During an operation of sucking the component, a negative-pressure suction force is given from the negative-pressure generator unit to the distal end of the sucking nozzle to allow the sucking nozzle to suck and hold the component. In this embodiment, a combination of the drive shaft 34 and the nozzle 35 is equivalent to a "component-holding member" in the appended claims.

The nozzle 35 (drive shaft 34) is adapted to be capable of an up/down movement (movement in the Z-axis direction) and a rotation about a nozzle axis (R-axis). The nozzle 35 (drive shaft 34) is also driven by each of an up/down driving mechanism and a rotation driving mechanism. Among these two driving mechanisms, the up/down driving mechanism is incorporated in each of the heads 16. A structure of the head 16 including the up/down driving mechanism, and a structure of the rotation driving mechanism for the nozzle 35, will be described later.

A board-imaging unit 24 is mounted to the head unit 15. The board-imaging unit 24 is provided with an area camera having an image pickup device such as a CCD, and an illuminating device. The board-imaging unit 24 is fixed to the head unit in a downwardly facing posture, and adapted to be capable of imaging various types of marks on the board P carried in the operation station.

As shown in FIG. 1, a component-imaging unit 25 is provided on the base 10 to image the component sucked by each of the heads 16 (nozzles 35) of the head unit 15. As with the board-imaging unit 24, the component-imaging unit 25 is made up of an area camera, an illuminating device and others, and fixed onto the base 10 in an upwardly facing posture. Thus, when the head unit 15 is set at a position just above the component-imaging unit 25 after sucking the component, the component sucked by each of the heads can be imaged by the component-imaging unit 25.

Specific structures of the head unit 15 and each of the heads 16 will be described below.

As mentioned above, the ten heads 16 are mounted to the head unit 15. Each of the heads 15 is a unitize member having a flat shape when viewed in the X-axis direction. As shown in FIG. 2, the ten heads 15 are integrally fixed to the head unit 15 in a state where they are arranged side by side in the X-axis direction.

Figure 3:
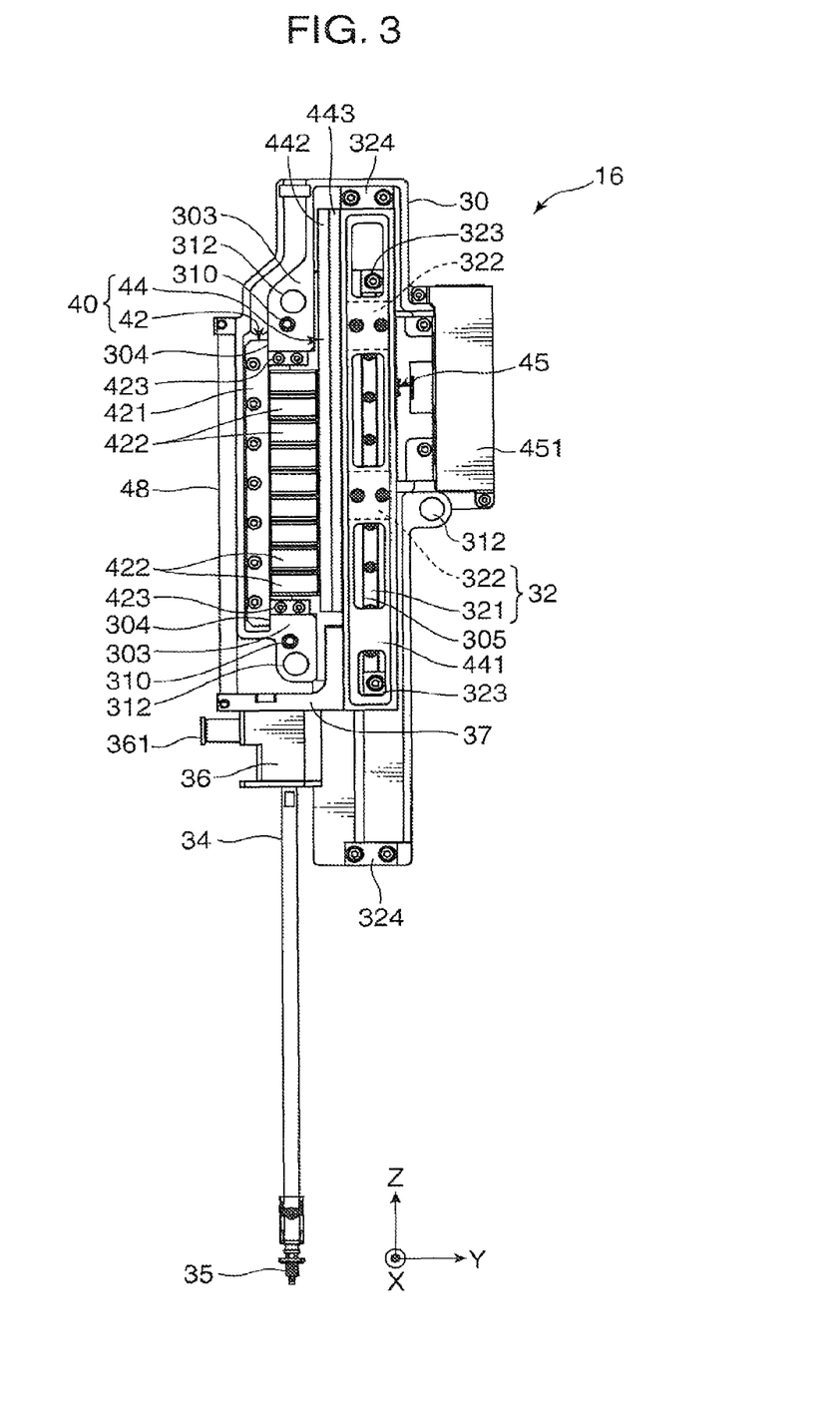
FIG. 3 is a side view showing a head mounted to the head unit (a sectional view taken along the arrowed line III-III in FIG. 2).
Figure 4:
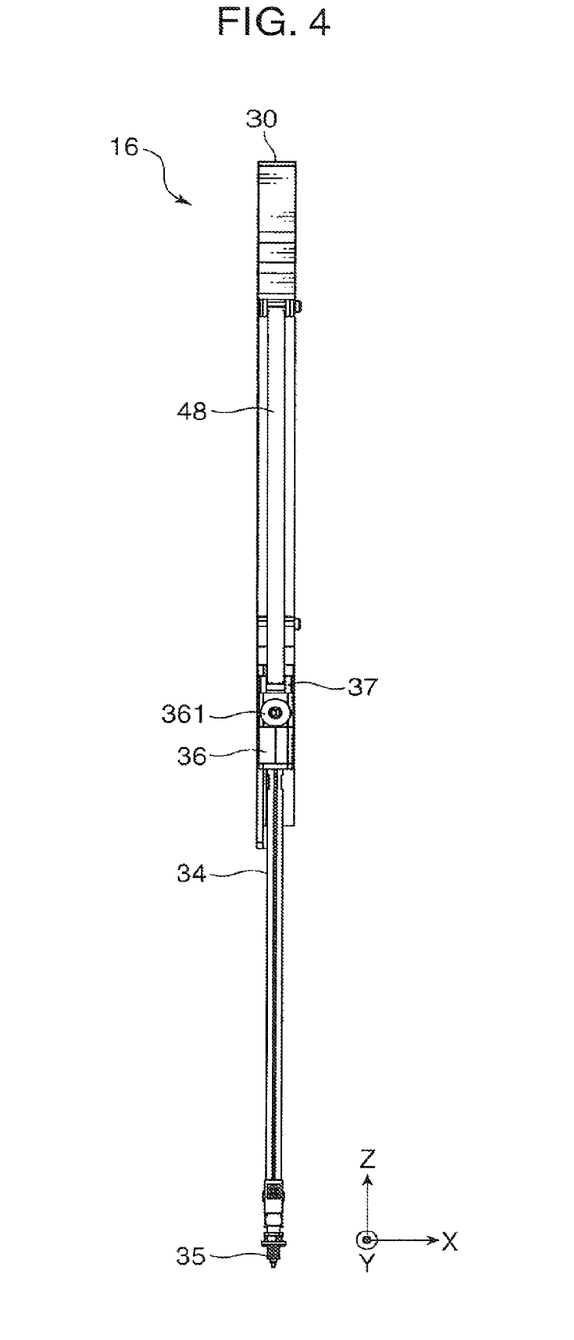
FIG. 4 is a front view showing a structure of the head.
Figure 5:
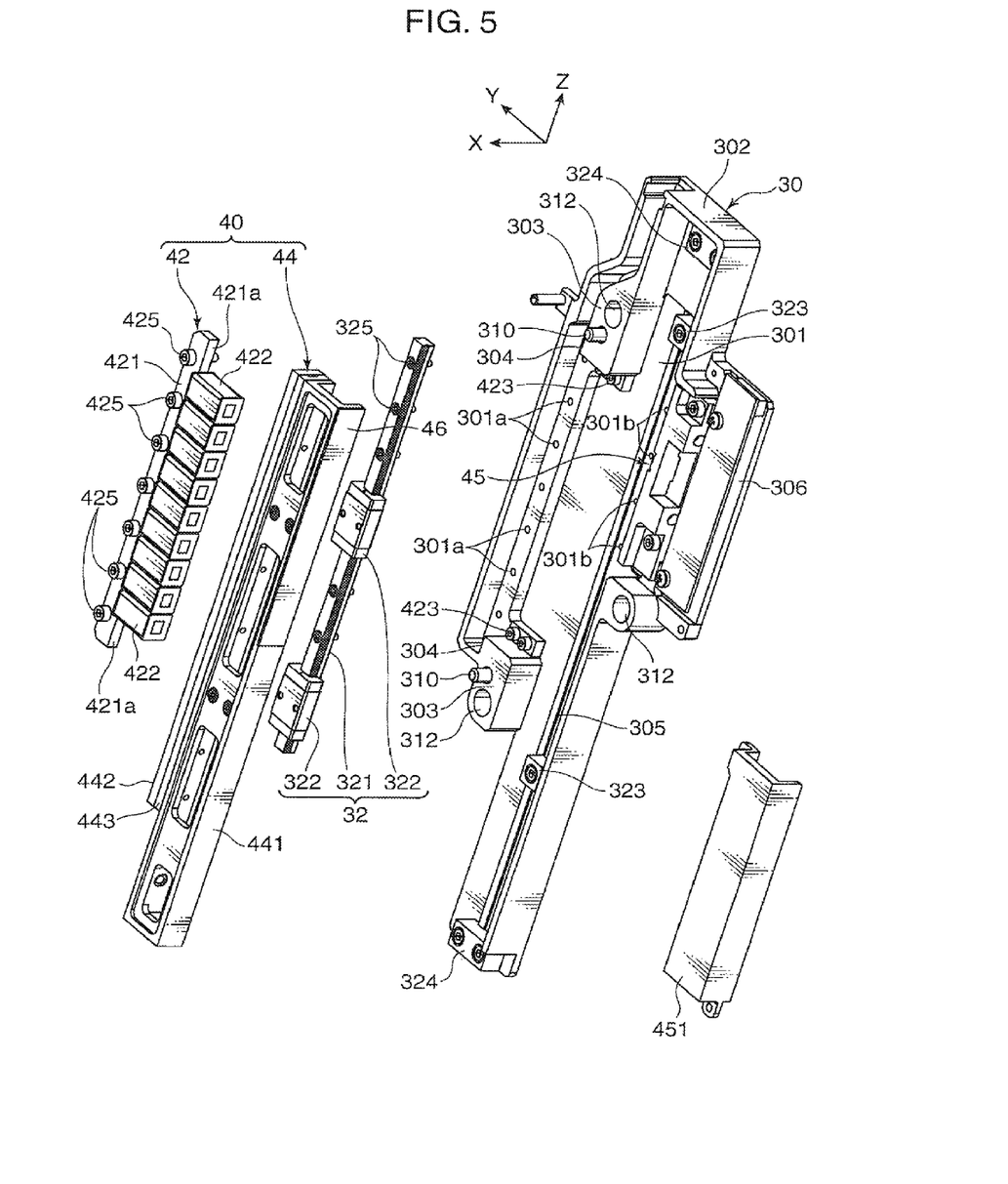
FIG. 5 is an exploded perspective view showing the structure of the head.

FIGS. 3 to 5 show a specific structure of the head 16, wherein FIGS. 3, 4, and 5 are, respectively, a side view (a sectional view taken along the arrowed line III-III in FIG. 2, a front view, and an exploded perspective view. In FIG. 5, a part of components, such as the drive shaft 34, is omitted for the sake of simplicity.

The head 16 is roughly provided with the drive shaft 34 disposed at the lower end of the nozzle 35, a linear motor for driving the drive shaft 34, the nozzle 35 and others in the Z-axis direction, and a return spring 48 applying an upward biasing force to the nozzle 35 and others.

The linear motor includes: a frame 30 (corresponding to a frame member in the appended claims); a linear guide 32 assembled to the frame 30; a stator 42 provided on the frame 30; and a linear motor body 40 which has a mover 44 provided on the linear guide 32 and adapted to integrally drive the drive shaft 34 in the Z-axis direction. The head 16 is unitized by incorporating the drive shaft 34 and the return spring 34 into the linear motor. The linear motor is operable to drive the nozzle 35 (drive shaft 34) in the Z-axis direction, while the return spring 48 is operable, during rest of the linear motor, to hold the nozzle 35 at its upper position by the biasing force thereof.

The frame 30 is a member which has a flat dish-like shape when viewed from the X-axis direction. The frame 30 is provided with a base plate 301 having a sidewall portion 302 in a part of a periphery thereof, and made of an aluminum alloy subjected to a surface treatment, or any other similar material.

The linear guide 32 is provided with a rail 321 extending in the Z-axis direction; and a plurality of sliders 322, 322 mounted to the rail 321 in a slidable manner in the Z-axis direction while being prohibited in directions perpendicular to the Z-axis direction. The rail 321 is incorporated in the frame 30 in such a manner that it is fixed to the base plate 301 by a bolt. The rail 321 is also adapted to guide the drive shaft 34 in the Z-axis direction through the mover 44 (which will be described in detail later) of the linear motor body 40.

The stator 42 of the linear motor body 40 is formed as an armature which includes a comb-shaped core 421 having a plurality of teeth arranged side by side in the Z-axis direction (a moving direction of the mover 44) in a spaced-apart relation to each other, a plurality of coils 422 attached onto respective ones of the teeth of the core 421, and a pair of sub-teeth 423, 423 each provided as a separate member from the core 421. Each of the core 421 and the sub-teeth 423, 423 is fixed to the base plate 301 by bolts. As shown in FIG. 3, the sub-teeth 423, 423 are fixed to be located in parallel relation to each other in the Z-axis direction at respective ones of opposite end of the array of the coils 422. The sub-teeth 423, 423 are provided as means to supplement formation of magnetic fluxes at opposite ends of the core 421 during motor driving to reduce a so-called cogging force. Although the sub-teeth 423, 423 in this embodiment are provided as a separate member from the core 421, it is understood that these members may be provided integrally with the core 421.

The mover 44 of the linear motor body 40 is formed as a field element, and is provided in side-by-side relation to the stator 42 in the Y-axis direction. The mover 44 is provided with a slide base 441 with a squared U-shaped in cross section extending in the Z-axis direction, a yoke 443 fixed to a lateral surface (surface opposed to the stator 42) of the slide base 441, and an array of permanent magnets 442 arranged on the slide base 441 through the yoke 443. Specifically, a permanent magnet 442 having an N-pole on the side of the stator 42 and an S-pole on the side of the mover 44 in the Y-axis direction, and a permanent magnet 442 having an S-pole on the side of the stator 42 and an N-pole on the side of the mover 44 in the Y-axis direction, are alternately arranged in the Z-axis direction. The mover 44 is adapted to be assembled, when it (the slide base 441 thereof) is fixed to the sliders 322 of the linear guide 32, to the frame 30 in a manner as to reciprocate only in the Z-axis direction, and, in response to a given drive signal applied from a linear drive control section (not shown) to the stator 42 of the linear motor body 40, to be driven in the Z-axis direction, at a speed and in a direction according to the drive signal.

The stator 42 and the mover 44 are fixed to the frame 30 in a state where a given gap is defined therebetween (exactly, between an edge portion of the comb-shaped core 421 on the side of the mover and a surface of the permanent magnet array 442 on the side of the stator).

In this embodiment, this gap can be defined accurately and precisely with a significantly simple technique.

Specifically, a pair of protruding portion 303, 303 (which are equivalent to a first positioning portion in the appended claims) each having a stator-positioning reference surface are integrally formed with the base plate 301, while a pair of extension portions 421a, 421a extending in the Z-axis direction (arrangement direction of the teeth) are integrally formed at respective ones of the opposite ends of the core 421 of the stator 42 in corresponding relation to the respective protruding portion 303, 303. A surface of each of the extension portions 421a, 421a of the core 421 on the side of the mover 44 is butted against a corresponding one of the reference surfaces of the protruding portion 303, 303. In this state, a bolt 425 inserted into a through-hole formed in the core 421 is screwed with a screw hole 301a of the base plate 301. In this manner, the stator 42 is assembled to the frame 30 in a state where it is set at a given fixing position predetermined in the base plate 301.

Also a mover-positioning protrusion 305 (which is equivalent to a second positioning portion in the appended claims) is integrally formed with the base plate 301 of the frame 30. A portion of the rail 321 on the side of the stator 42 is butted against a portion of the protrusion 305 on aside opposite to the stator 42 (in FIG. 3, a right side). In this state, a bolt 325 inserted into a through-hole formed in the rail 321 is screwed with a screw hole 301b of the base plate 301. In this manner, the mover 44 is assembled to the frame 30 in a state where it is positioned in the Y-axis direction through the linear guide 32. The mover 44 may be assembled to a predetermined position of the sliders 322 after the rail 321 is assembled to the base plate 301, or the rail 321 may be assembled to the base plate 301 after the mover 44 is pre-assembled to the sliders 322.

As mentioned above, each of the stator 42 and the mover 44 is assembled to the frame 30 in the positioned state, so that a gap having a given size is defined between the stator 42 and the mover 44 in the Y-axis direction. In FIGS. 3 and 5, the reference numeral 323 designates a stopper for restricting a movement of the sliders 322 in the Z-axis direction, and the reference numeral 324 designates a stopper for restricting a movement of the mover 44 (the slide base 441 thereof) in the Z-axis direction. Each of the stoppers is fixed to the base plate 301 by a bolt.

The drive shaft 34 is attached to the mover 44 of the linear motor designed as mentioned above. Specifically, a mounting arm 37 extending toward a lower position of the stator 42 in the Y-axis direction is fixed to a lower end of the slide base 441, and the drive shaft 34 is attached to a lower surface of the mounting arm 37 through a shaft support member 36.

The drive shaft 34 is formed of a hollow shaft, and supported by a spline mechanism (not shown) or the like in an axially displaceable manner and in a rotatable manner about the shaft axis (about the R-axis) relative to the shaft support member 36. The shaft support member 36 is formed with a negative pressure-introducing port 361 and a negative-pressure passage (not shown). The drive shaft 34 is connected to the negative-pressure generator unit via the port 361 and others.

The return spring 48 is disposed at a position opposite to the linear guide 32 with respect to the stator 42 of the linear motor body 40 in the Y-axis direction. The return spring 48 is mounted to be bridged between an upper end portion of the frame 30 and the mounting arm 37 in the Z-axis direction. The return spring 48 applies an upward biasing force to the drive shaft 34 through the mounting arm 37 and the shaft support member 36.

A magnetic sensor 45 is incorporated in the head to serve as a position-detecting sensor for detecting respective positions of the mover 44 and the drive shaft 34 (nozzle 35). Specifically, as shown in FIG. 5, a plate-shaped magnetic scale 46 magnetically recorded with a scale is fixed to the mover 44 of the linear motor body 40 along the slide base 441. Also, the magnetic sensor 45, such as an MR (magneto-resistive) sensor or a Hall sensor, is attached to a sensor support portion 306 provided on the base plate 301. The magnetic sensor 45 is operable to read the magnetic scale 46 to detect respective positions of the mover 44 and the drive shaft 34 (nozzle 35). In FIG. 3, the reference numeral 451 designates a cover member covering a control board of the magnetic sensor 45 and others.

Figure 6:
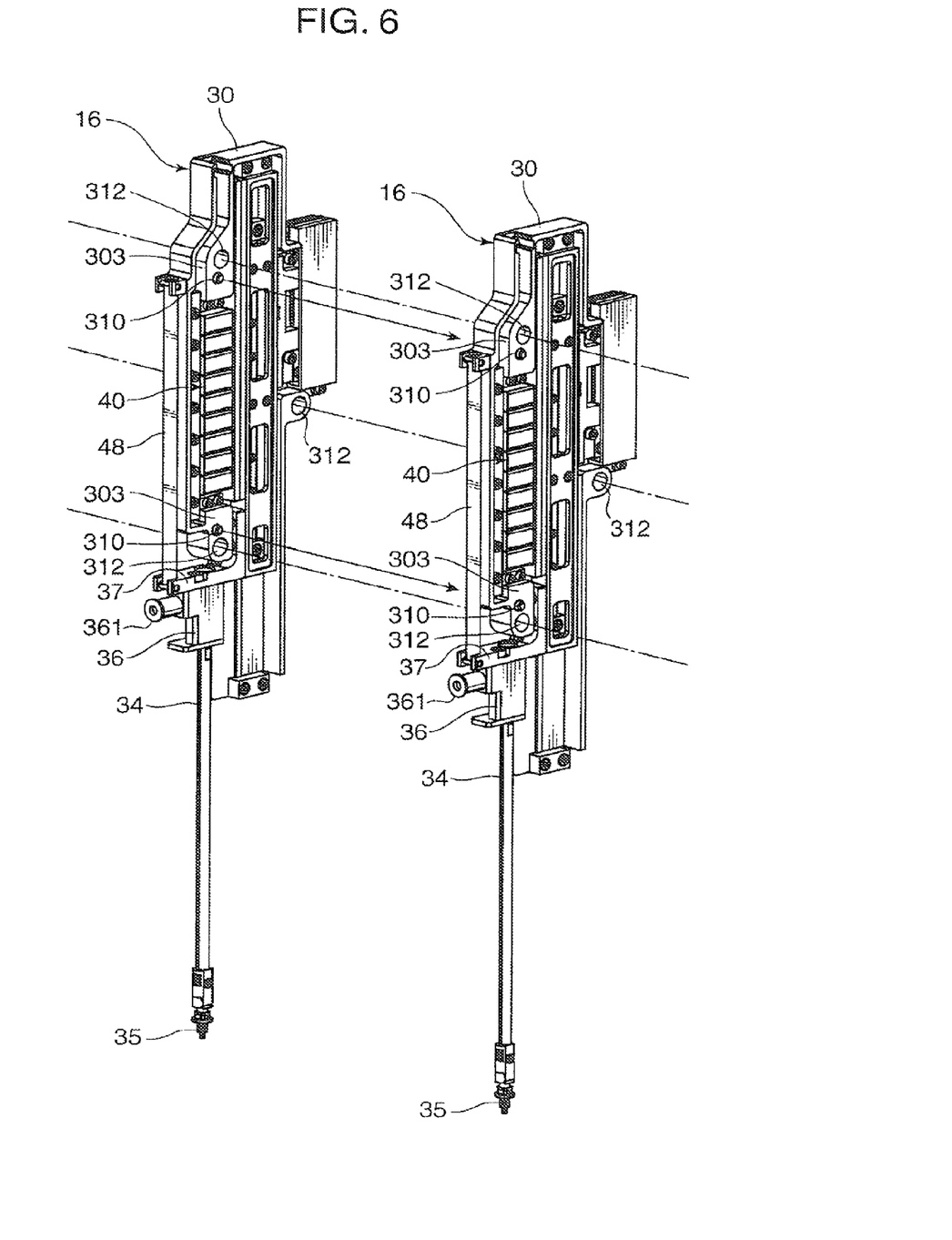
FIG. 6 is a perspective view for explaining a process of assembling each of a plurality of the heads to the head unit.

The ten heads 16 designed as mentioned above are stacked to each other in the X-axis direction in such a manner that the return spring 48 is located on the side of a front surface of the head unit 15 (on a side opposite to a portion of the stator 42 on the side of the head-unit support member 18), and then integrally fixed. More specifically, a pair of positioning pins 310, 310 are provided on respective ones of surfaces of the protruding portion 303 on the side of an assembling surface for the linear guide 32 and others, while a pair of positioning holes (not shown) are formed in respective the other surfaces opposite to the first surfaces, in concentrically corresponding relation to respective ones of the positioning pins 310 in a stacking direction of the frames 30. Each of the positioning pins 310, 310 of the head 16 located on a bottom side in the laminating direction (on a side where the assembling surface for the linear guide 32 and others is covered in the X-axis direction) is inserted into a corresponding one of the positioning holes of the head 16 adjacent to and on a top side of the bottom-side head 16 (on aside for covering the assembling surface for the linear guide 32 and others, in the X-axis direction). The heads 16 are thus stacked together in the X-axis direction, in a positioned state. Also, the stacked heads 16 are sandwiched between a pair of mounting frames 15b from opposite sides in the X-axis direction and the mounting frames 15b. The stacked heads 16 are integrally fastened by a bolt 151, which penetrates through a through-hole formed in each of the frames 30, and a nut 152. Then, the mounting frames 15b are fixed to a body frame 15a of the head unit 15 in a positioned state. In this manner, the ten heads 16 are integrally fixed to the head unit 15.

As shown in FIG. 2, the drive shaft 34 of each of the heads 16 fixed to the head unit 15 is held by a holding portion 15c provided on the body frame 15a.

The rotation driving mechanism for the drive shaft 34 is provided with the holding portion 15c supporting the drive shaft 34 in a rotatable manner about the Z-axis, and a plurality of drive motors (rotary-type motors) 26, 26 fixed to the body frame 15a. A rotational driving force is transmitted from a drive pulley (not shown) of each of the drive motors 26, 26 to each of the drive shaft 34 via a drive belt (not shown) or the like.

In the component mounting apparatus designed as mentioned above, a component mounting operation is performed as follows.

Referring to FIG. 1, the head unit 15 is firstly moved to the feeder installation area 13 to suck the component by each of the heads 16. Specifically, after a given head 16 is set at a position just above the tape feeder 14, the drive shaft 34 is moved according to up/down driving by the linear motor. The nozzle 35 is thus moved downwardly to suck and to pick up the component in the tape. In this step, if possible, plural components may be simultaneously picked up by two or more of the heads 16. After completion of suction of the components, the head unit 15 is moved to a position just above the board P along a given passage through a position just above the component-imaging unit 25. During this movement, a state of the component sucked by each of the heads 16 (nozzles 35) is image-recognized, and a correction amount during mounting is calculated. When the head unit 15 reaches a first mounting position just above the board P, the drive shaft 34 is then moved according to up/down driving by the linear motor, to mount one of the components onto the board P. Subsequently, the head unit 15 will be sequentially moved to other mounting positions to mount the remaining components on the board P.

In the above component mounting according to the present invention, the head 16 is designed such that the nozzle 35 (drive shaft 34) is driven up and down by a linear motor-type driving mechanism. In addition, the linear motor making up each of the heads 16 is designed such that a gap having a given size is naturally defined between the stator 42 and the mover 44 by fixing the stator 42 and the mover 44 to the frame 30, if (the surfaces of the extension portions 421a, 421a formed on the mover side of the core 421 of) the stator 42 is brought into contact with the protruding portion 303, 303 while (the surface formed on the stator side of the rail 321 of) the linear guide 32, which is, for example, pre-assembled the mover 44, is brought into contact with the protrusion 305. In this assembling process, a displacement of the extension portions 421a, 421a toward the mover 44 is restricted by the protruding portion 303, 303, while a displacement of the rail 321 toward the stator 42 is restricted by the protrusion 305. Under the aforementioned condition, the stator 42 and the mover 44 can be drawn toward each other by means of a magnetic attraction force between the core 421 and the permanent magnet array 442. Thus, a gap to be defined between the stator 42 and the mover 44 naturally becomes highly accurate. Also, positioning of the stator 42 and the mover 44 is achieved using the protruding portion 303, 303 and the protrusion 305 formed on the frame 30. Therefore, during the operation of assembling the stator 42 and the mover 44 to the frame 30, the gap having the given size can be adequately ensured without performing the gap adjustment using a shim as in the conventional technique. Thus, it becomes possible to perform assembling of the linear motor, i.e., assembling of the head 16 in this embodiment, easily and quickly.

In addition, the linear motor is designed such that the stator 42 is positioned by bringing the mover 44 side surfaces of the extension portions 421a, 421a into contact with the protruding portion 303, 303, while the mover 44 is positioned by bringing the stator 42 side surface of the rail 321 into contact with the protrusion 305. Therefore, the stator 42 and the mover 44 can be drawn toward each other by means of a magnetic attraction force between the core 421 and the permanent magnet array 44. Thus, it becomes possible to further enhance the assembling accuracy, preventing the stator 42 and the mover 44 from being unduly attached magnetically to each other.

In the component mounting apparatus according to this embodiment, the ten heads 16 are mounted to the head unit 15, as mentioned above. Thus, ease of assembles of the entire apparatus including the linear motor assembling process is also improved because of the aforementioned enhanced ease of assembles of the head 16 (linear motor). Also, a variation in the gap between the heads 16 can be suppressed, so that an up/down movement of the nozzle can be uniformly performed between the heads 16. Thus, there is another advantage of being able to prevent the occurrence of a problem caused by a variation in movement between the heads 16, such as an unfavorable situation where, despite the heads 16 are controlled in accordance with the same program, asynchronous up/down movements of the nozzles occur in a part of the heads 16, and thereby a defect in suction or mounting of the component becomes more likely to occur.

The above component mounting apparatus is one example of a preferred embodiment of a component mounting apparatus using the linear motor according to the present invention (a component mounting apparatus according to the present invention), and a specific structure thereof may be appropriately modified without departing from the spirits and scope of the present invention.

For example, in the linear motor according to the above embodiment, the extension portions 421a are integrally formed at the opposite ends of the core 421 in the arrangement direction of the teeth, and the stator 42 is positioned with respect to the frame 30 by bringing the extension portions 421a into contact with respective ones of the protruding portions pairs 303, 303 formed on the base plate 301. Alternatively, for example, the linear motor may be designed such that a positioning recess portion is formed in the base plate 301, and a protruding portion is provided on a surface of the core 421 to be disposed on the base plate 301, wherein the protruding portion is fitted into the recess portion to position the stator 42. However, in the positioning structure in the above embodiment, the stator 42 can be positioned using a portion thereof outside the coils. Thus, the stator 42 can be adequately positioned without exerting an adverse effect on formation of magnetic fluxes between the stator 42 and the mover 44. Also, the core 421 having relatively high rigidity is used as a portion to be positioned. Thus, there is an advantage of being able to reduce a risk of deformation or the like to provide enhanced reliability.

Although the linear motor according to the above embodiment is designed such that the stator 42 and the mover 44 are positioned by bringing the stator 42 into contact with the protruding portion 303 from a side opposite to the mover 44 with respect to the protruding portion 303, and bringing the rail 321 into contact with the protrusion 305 from a side opposite to the stator 42 with respect to the protrusion 305, it is understood that the directions for bringing the stator 42 and the rail 321 (linear guide 32) into contact with the protruding portion 303, 303 and the protrusion 305 serving as the first and second positioning portions are not particularly limited, as long as the stator 42 and the mover 44 can be adequately positioned.

Although it is not mentioned in the description of the above embodiments, the core 421 of the stator 42 in the above embodiments has a structure where a plurality of plate-shaped element members are laminated in a direction (X-axis direction) perpendicular to the arrangement direction of the teeth. Thus, in view of fixing the stator 42 to the frame 30 stably and strongly while maintaining the integrity of the entire core, the stator 42 is fixed to the frame 30 by forming a through-hole in the core 421 to penetrate therethrough in a laminating direction of the element members (X-axis direction), and screwing a bolt 425 inserted into the through-hole, with a screw hole 301a of the base plate 301. In cases where the core 421 is a single-piece block-shaped member, the stator 42 may be fixed to the frame 30, for example, by forming a through-hole in the extension portion 421a of the core 421 to penetrate therethrough in the Y-axis direction, and screwing a bolt inserted into the through-hole, with the protruding portion 303.

In the linear motor according to the above embodiment, the protruding portion 303 and the protrusion 305 serving as the first and second positioning members are integrally formed with the frame 30. Alternatively, for example, each of the protruding portion 303 and the protrusion 305 may be provided as a separate member from the frame 30, and fixed to the frame 30 by fastening means, such as a bolt. However, in view of reliability of positioning, it is preferable to integrally form them with the frame 30 as in the above embodiment.

Although the above embodiments have been described based on an example where the present invention is applied to a component mounting apparatus, an apparatus suited to use the present invention is not limited to the component mounting apparatus, but the present invention may also be applied, for example, to a component inspecting apparatus which is provided with a movable head unit equipped with a component-holding member capable of holding a component, wherein component inspecting apparatus is designed such that the component-holding member is driven up and down relative to the head unit by a driving mechanism having the linear motor, to pick up a component from a component supply position and transfer the component to and from a given inspection section.

As described above, according to one aspect of the present invention, there is provided a linear motor which is equipped with a field element and an armature and adapted to produce a force causing the field element and the armature to be relatively displaced along a given axial direction by interaction of magnetic fluxes generated between the field element and the armature during an operation of supplying electric power to the armature. The linear motor is provided with: a stator formed as one of the field element and the armature; a mover formed as the other of the field element and the armature; a frame member defining the axial direction; a rail adapted to guide the mover allowing only to reciprocate in a linear direction; a first positioning portion provided on the frame member to set a fixing position of the stator with respect to the frame member; and a second positioning portion provided on the frame member to set a fixing position of the rail with respect to the frame member in such a manner as to allow the mover to reciprocate along the axial direction with a given gap formed between the mover and the stator positioned by the first positioning portion.

In the above structure of the linear motor, the stator is fixed to the frame member while being positioned by the first positioning portion. Also, the rail with the mover pre-assembled is fixed to the frame member while being positioned by the second positioning portion. Thus, the stator is fixed to the frame member along the axial direction, and the mover is assembled in a manner being allowed to reciprocate along the axial direction with a given gap formed between the mover and the stator. In this manner, the fixing positions of the stator and the mover are set using the first and second positioning portions formed on the frame member. This makes it possible to perform a motor assembling operation easily and quickly without performing gap adjustment using a shim during assembling of the stator and the mover as in the conventional technique.

In a preferred embodiment, the first positioning portion is adapted to be in contact with a surface of the stator on the side of the mover so as to position the stator with respect to the frame member, and the second positioning portion is adapted to be in contact with a surface of the rail on the side of the stator so as to position the mover with respect to the frame member.

In this structure, the stator and the mover can be drawn toward each other by means of a magnetic attraction force between the field element and the armature each formed as the stator or the mover, under a condition that the first and second positioning portions restrict a displacement in a direction along which the mover and the stator 42 tend to come closer to each other. Thus, it becomes possible to prevent the stator and the mover from being unduly attached magnetically to each other due to the magnetic attraction force, during assembling. In addition, the stator and the mover are drawn toward each other by means of the magnetic attraction force, so that the stator and the mover are reliably brought into contact with corresponding ones of the positioning portions. Thus, a dimensional accuracy of a gap to be defined naturally becomes higher.

In a preferred embodiment, the mover consists of the field element provided with a plurality of magnets arranged side by side in the axial direction in such a manner that surface polarities of the magnets on a side opposed to the stator differ from one another, and the stator consists of the armature provided with a core having a plurality of teeth arranged side by side in the axial direction, and a coil attached to the teeth of the core. Opposite ends of the stator in an arrangement direction of the teeth of the core are formed as a pair of extension portions extending along the axial direction in a parted manner at the ends in the axial direction. The first positioning portion is a pair of protruding portions, provided in spaced-apart relation to each other by a given distance in the axial direction in such a manner to allow surfaces of the extension portions pairs to be brought into contact with respective ones thereof during assembling, for positioning the stator with respect to the frame member.

According to the above structure where the extension portions pairs are provided at the opposite ends of the core of which the surfaces on the side of the mover are brought into contact with the protruding portions pairs serving as the first positioning portion, a coil region can be interposed between the protruding portion to allow the stator to be positioned outside the coil region. Therefore, the stator can be adequately positioned without exerting an adverse effect on formation of magnetic fluxes between the stator and the mover. Also, the core having relatively high rigidity is used as a portion to be positioned. Thus, a risk of deformation or the like is reduced to provide enhanced reliability of positioning.

In a preferred embodiment, the core is formed by a plurality of plate-shaped element members laminated in a laminating direction perpendicular to the axial direction and a longitudinal direction of the teeth, the core is formed therein a through-hole passing through in the laminating direction of the element members, and the stator is fixed to the frame member by a bolt inserted into the through-hole.

While various fixing techniques may be employed as a specific method for fixing the stator to the frame member, the above fixing structure can preferably be employed to allow the stator to be fixed to the frame member stably and strongly maintaining the integrity of the entire core, in case the core is formed by laminating a plurality of plate-shaped element members in a laminating direction perpendicular to the axial direction and a longitudinal direction of the teeth.

While each of the positioning portions may be formed separately from the frame member, and fixed to the frame member by a bolt or the like, it is preferable that the first and second positioning portions are integrally formed with the frame member, in view of enhancing reliability of positioning.

According to another aspect of the present invention, there is provided a component mounting apparatus provided with a component-holding member, and a driving mechanism adapted to drive the component-holding member up and down. The component mounting apparatus is operable to pick up a component from a component supply position and mount the component on a board, according to the up/down movement of the component-holding member. The component mounting apparatus is provided with any one of the aforementioned linear motors which make up the driving mechanism.

According to yet another aspect of the present invention, there is provided a component inspecting apparatus provided with a component-holding member, and a driving mechanism adapted to drive the component-holding member up and down. The component inspecting apparatus is operable to pick up a component from a component supply position and transfer the component to and from a given inspection section, according to the up/down movement of the component-holding member. The component inspecting apparatus is provided with any one of the aforementioned linear motors which make up the driving mechanism.

The invention claimed is:

1. A linear motor equipped with a field element and an armature, the linear motor adapted to produce a force causing the field element and the armature to be relatively displaced along a given axial direction by interaction of magnetic fluxes generated between the field element and the armature during an operation of supplying electric power to the armature, comprising:
   a stator formed as one of the field element and the armature;
   a mover formed as the other of the field element and the armature;
   a frame member defining the axial direction;
   a rail adapted to guide the mover allowing only to reciprocate in a linear direction;
   a first positioning portion provided on the frame member to set a fixing position of the stator with respect to the frame member; and
   a second positioning portion provided on the frame member to set a fixing position of the rail with respect to the frame member in such a manner as to allow the mover to reciprocate along the axial direction with a given gap formed between the mover and the stator positioned by the first positioning portion.

2. The linear motor as defined in claim 1, wherein:
   the first positioning portion is adapted to be in contact with a surface of the stator on the side of the mover so as to position the stator with respect to the frame member; and
   the second positioning portion is adapted to be in contact with a surface of the rail on the side of the stator so as to position the mover with respect to the frame member.

3. The linear motor as defined in claim 1, wherein:
   the mover consists of the field element comprising a plurality of magnets arranged side by side in the axial direction in such a manner that surface polarities of the magnets on a side opposed to the stator differ from one another;
   the stator consists of the armature comprising a core having a plurality of teeth arranged side by side in the axial direction, and a coil attached to the teeth of the core;
   opposite ends of the stator in an arrangement direction of the teeth of the core are formed as a pair of extension portions extending along the axial direction in a parted manner at the ends in the axial direction; and
   the first positioning portion is a pair of protruding portion, provided in spaced-apart relation to each other by a given distance in the axial direction in such a manner as to allow surfaces of the extension portions pairs to be brought into contact with respective ones thereof during assembling, for positioning the stator with respect to the frame member.

4. The linear motor as defined in claim 3, wherein the core is formed by a plurality of plate-shaped element members laminated in a laminating direction perpendicular to the axial direction and a longitudinal direction of the teeth, the core is formed therein a through-hole passing through in the laminating direction of the element members, and the stator is fixed to the frame member by a bolt inserted into the through-hole.

5. The linear motor as defined in claim 4, wherein the first and second positioning portions are integrally formed with the frame member.

6. A component mounting apparatus including a component-holding member, and a driving mechanism adapted to drive the component-holding member up and down, wherein the component mounting apparatus is operable to pick up a component from a component supply position and mount the component on a board, according to the up/down movement of the component-holding member,
   wherein the driving mechanism comprises the linear motor equipped with a field element and an armature, the linear motor adapted to produce a force causing the field element and the armature to be relatively displaced along a given axial direction by interaction of magnetic fluxes generated between the field element and the armature during an operation of supplying electric power to the armature, the linear motor comprising:

a stator formed as one of the field element and the armature;

a mover formed as the other of the field element and the armature;

a frame member defining the axial direction;

a rail adapted to guide the mover allowing only to reciprocate in a linear direction;

a first positioning portion provided on the frame member to set a fixing position of the stator with respect to the frame member; and a second positioning portion provided on the frame member to set a fixing position of the rail with respect to the frame member in such a manner as to allow the mover to reciprocate along the axial direction with a given gap formed between the mover and the stator positioned by the first positioning portion.

7. A component inspecting apparatus including a component-holding member, and a driving mechanism adapted to drive the component-holding member up and down, wherein the component inspecting apparatus is operable to pick up a component from a component supply position and transfer the component to and from a given inspection section, according to the up/down movement of the component-holding member, wherein the driving mechanism comprises the linear motor equipped with a field element and an armature, the linear motor adapted to produce a force causing the field element and the armature to be relatively displaced along a given axial direction by interaction of magnetic fluxes generated between the field element and the armature during an operation of supplying electric power to the armature, the linear motor comprising:

a stator formed as one of the field element and the armature;

a mover formed as the other of the field element and the armature;

a frame member defining the axial direction;

a rail adapted to guide the mover allowing only to reciprocate in a linear direction;

a first positioning portion provided on the frame member to set a fixing position of the stator with respect to the frame member; and a second positioning portion provided on the frame member to set a fixing position of the rail with respect to the frame member in such a manner as to allow the mover to reciprocate along the axial direction with a given gap formed between the mover and the stator positioned by the first positioning portion.

\* \* \* \* \*